(12) United States Patent
Yamada (10) Patent No.: US 9,059,059 B2
(45) Date of Patent: Jun. 16, 2015

(54) SOLID STATE IMAGE SENSOR HAVING A FIRST OPTICAL WAVEGUIDE WITH ONE CONTIGUOUS CORE AND A SECOND OPTICAL WAVEGUIDE WITH PLURAL CORES

(71) Applicant: Canon Kabushiki Kaisha, Ohta-ku, Tokyo (JP)

(72) Inventor: Daisuke Yamada, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/183,878

(22) Filed: Feb. 19, 2014

(65) Prior Publication Data

US 2014/0168487 A1    Jun. 19, 2014

Related U.S. Application Data (62) Division of application No. 13/298,788, filed on Nov. 17, 2011, now Pat. No. 8,681,259.

(30) Foreign Application Priority Data

Nov. 29, 2010  (JP) .................................. 2010-264609

(51) Int. Cl.
*H01L 27/146*     (2006.01)
*H04N 5/369*     (2011.01)
(Continued)

(52) U.S. Cl.
CPC .... *H01L 27/14625* (2013.01); *H01L 27/14623* (2013.01); *H01L 27/14629* (2013.01); *G02B 7/28* (2013.01); *G02B 6/4298* (2013.01);
(Continued)

(58) Field of Classification Search
CPC .................... H01L 27/14685; H01L 27/14625; H01L 27/14629; H01L 27/14623; H01L 27/1463; H04N 5/2254; H04N 5/3696; G02B 6/4298; G02B 7/28; G02B 6/1228; G02B 6/1204
USPC ............ 348/207.99, 294, 302, 308, 340, 345; 257/292, 294, 432, 444; 396/128; 250/208.1; 359/619; 385/14
See application file for complete search history.

(56) References Cited

U.S. PATENT DOCUMENTS 5,396,570 A   3/1995  Jenkins et al.
6,829,008 B1  12/2004 Kondo et al.
(Continued)

FOREIGN PATENT DOCUMENTS

JP    2006-261249    9/2006
JP    2008-109393    5/2008
(Continued)

*Primary Examiner* — Dennis Hogue
(74) *Attorney, Agent, or Firm* — Fitzpatrick, Cella, Harper & Scinto (57) ABSTRACT

A solid state image sensor has a plurality of ranging pixels on the imaging area thereof and each of the ranging pixels has a photoelectric conversion section and an optical waveguide arranged at the light-receiving side of the photoelectric conversion section. The optical waveguide has at least two optical waveguides including a first optical waveguide arranged at the light-receiving side and a second optical waveguide arranged at the side of the photoelectric conversion section in the direction of propagation of light. The core region of the first optical waveguide shows a refractive index lower than the refractive index of the core region of the second optical waveguide and is designed so as to show a high light-receiving sensitivity relative to light entering at a specific angle.

7 Claims, 6 Drawing Sheets

(51) Int. Cl.
*G02B 6/42* (2006.01)
*G02B 7/28* (2006.01)
*G02B 6/12* (2006.01)
*G02B 6/122* (2006.01)

(52) U.S. Cl.
CPC ........... *G02B6/12004* (2013.01); *G02B 6/1228* (2013.01); H04N 5/3696 (2013.01)

(56) References Cited

U.S. PATENT DOCUMENTS

| | | | |
|---|---|---|---|
| 8,648,435 B2 | 2/2014 | Konno | |
| 2003/0086008 A1* | 5/2003 | Nagano | 348/272 |
| 2005/0072906 A1 | 4/2005 | Dobashi | |
| 2005/0190453 A1* | 9/2005 | Dobashi | 359/619 |
| 2006/0278948 A1 | 12/2006 | Yamaguchi et al. | |
| 2007/0200055 A1 | 8/2007 | Reznik et al. | |
| 2007/0280587 A1* | 12/2007 | Makita | 385/14 |
| 2009/0090841 A1 | 4/2009 | Kusaka | |
| 2009/0110383 A1 | 4/2009 | Fujii | |
| 2010/0155870 A1 | 6/2010 | Tay et al. | |
| 2010/0244167 A1* | 9/2010 | Konno | 257/432 |
| 2010/0302432 A1 | 12/2010 | Komuro | |
| 2011/0199521 A1 | 8/2011 | Kato et al. | |
| 2011/0249161 A1 | 10/2011 | Takagi | |
| 2013/0038691 A1* | 2/2013 | Agranov et al. | 348/46 |

FOREIGN PATENT DOCUMENTS

| | | |
|---|---|---|
| JP | 2010-225939 | 10/2010 |
| WO | 2010/134626 | 11/2010 |

* cited by examiner

SOLID STATE IMAGE SENSOR HAVING A FIRST OPTICAL WAVEGUIDE WITH ONE CONTIGUOUS CORE AND A SECOND OPTICAL WAVEGUIDE WITH PLURAL CORES

This application is a divisional of application Ser. No. 13/298,788 filed Nov. 17, 2011, which in turn claims benefit of Japanese Patent No. 2010-264609 filed Nov. 29, 2010.

BACKGROUND OF THE INVENTION

1. Field of the Invention

The present invention relates to a solid state image sensor. More particularly, the present invention relates to a solid state image sensor to be used in a digital still camera, a digital video camera or the like.

2. Related Background Art

Distance measurement techniques for auto-focusing (AF) operations of digital still cameras and digital video cameras are known. With regard to such distance measurement techniques for AF operations, U.S. Pat. No. 6,829,008 proposes a solid state image sensor having some of its pixels provided with a distance measuring function and adapted to measure distances by way of phase detection.

Phase detection is a technique of measuring a distance by comparing the images of light passing through different regions on the pupil of a camera lens and measuring the distance by triangular surveying by means of stereo images.

This technique realizes high speed and high precision AF because the technique does not require any operation of moving a lens for measuring a distance unlike conventional contrast measurement.

It also realizes real time AF when picking up a moving image.

According to U.S. Pat. No. 6,829,008, an aperture is formed between the microlens and the photoelectric conversion section of a solid state image sensor at a position eccentric relative to the optical center of the microlens. With this arrangement, light passing through specific regions on the pupil of a camera lens can be selectively led to the photoelectric conversion section.

However, the above-described arrangement of an aperture at an eccentric position according to U.S. Pat. No. 6,829,008 may not necessarily be satisfactory for improving the accuracy of distance measurement because fluxes of light cannot be separated sufficiently due to scattering of light at the wiring section of the solid state image sensor.

Additionally, a problem as pointed out below can arise when the arrangement of U.S. Pat. No. 6,829,008 is applied to a small solid state image sensor having a small pixel size.

As the pixel size is reduced, the F value of the microlens for leading light to the photoelectric conversion section increases to make the size of diffraction image substantially equal to the pixel size.

Then, light expands in pixels and fluxes of light cannot be separated sufficiently at the eccentric aperture so that the obtained results may not necessarily be satisfactory for improving the accuracy of distance measurement.

SUMMARY OF THE INVENTION

In view of the above-identified problem, an object of the present invention is to provide a solid state image sensor that can highly precisely measure distances even when its pixel size is small.

According to the present invention, the above object is achieved by providing a solid state image sensor having a plurality of ranging pixels on the imaging area thereof, each of the ranging pixels having a photoelectric conversion section for converting light into an electric signal and an optical waveguide including a core region and a clad region arranged at the light-receiving side of the photoelectric conversion section; the optical waveguide having at least two optical waveguides including a first optical waveguide arranged at the light-receiving side and a second optical waveguide arranged at the side of the photoelectric conversion section in the direction of propagation of light; the core region of the first optical waveguide showing a refractive index lower than the refractive index of the core region of the second optical waveguide and designed so as to show a high light-receiving sensitivity relative to light entering at a specific angle.

Thus, the present invention can realize a solid state image sensor that can highly precisely measure distances even when its pixel size is small.

Further features of the present invention will become apparent from the following description of exemplary embodiments with reference to the attached drawings.

DETAILED DESCRIPTION OF THE PREFERRED EMBODIMENTS

A solid state image sensor according to the present invention can measure distances highly precisely as described above even when the pixel size is small. The present invention is made by paying attention to a phenomenon that the light propagation state (guided mode) in a pixel varies as a function of the angle of incidence of light entering the optical waveguide arranged in the pixel.

More specifically, the optical waveguide is formed in at least two stages in the direction of propagation of light and the refractive index of the core region at the light-receiving side is made lower than the refractive index of the core region at the side of the photoelectric conversion section.

With this arrangement, a solid state image sensor that can measure distances highly precisely is realized as a result of improving the light-receiving sensitivity relative to light entering at a specific angle and making light passing through a specific region on the pupil of a lens to be selectively received.

Now, the present invention will be described in greater detail below by referring to the accompanying drawings that illustrate embodiments of solid state image sensor according to the present invention. Throughout the drawings, the components having the same functions are denoted by the same reference numerals and will not be described repeatedly.

Now, the embodiments of the present invention will be described.

[First Embodiment]

The configuration of the solid state image sensor according to the first embodiment of the present invention will be described below by referring to FIG. 1.

Figure 1:
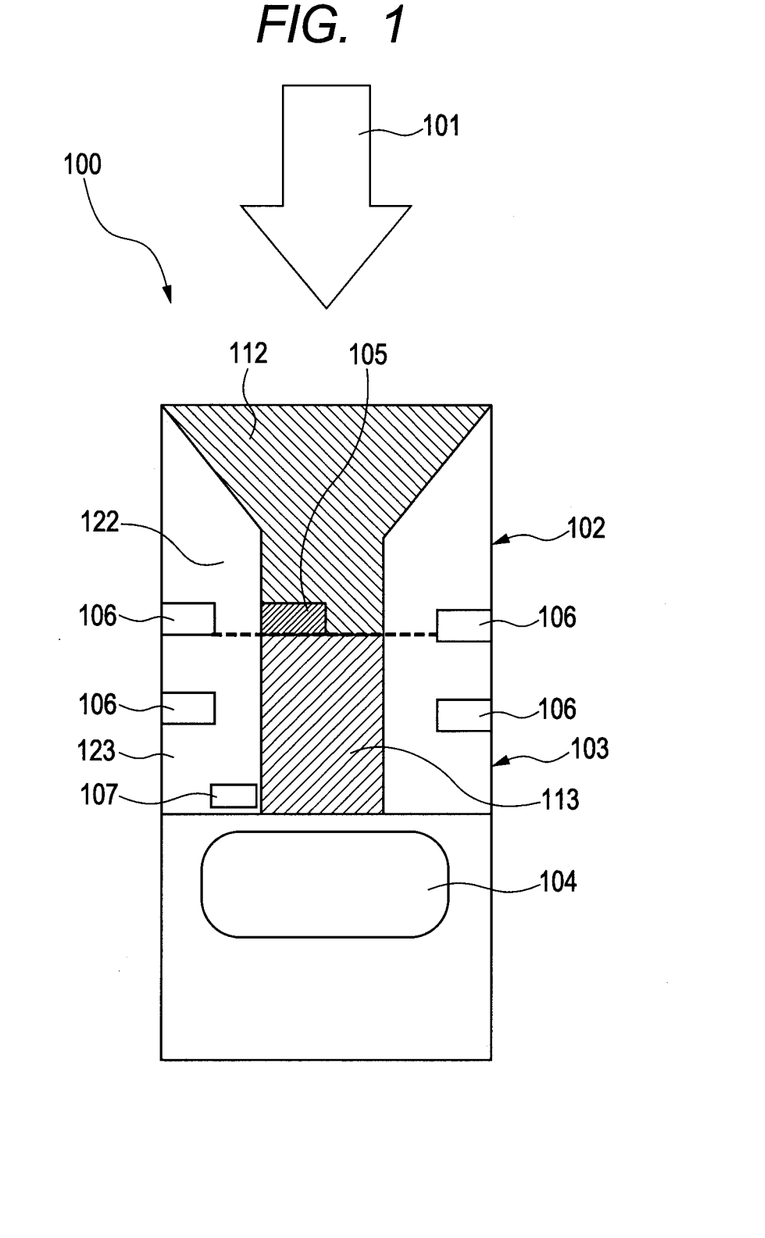
FIG. 1 is a schematic cross-sectional view of a ranging pixel arranged at a part of the solid state image sensor according to a first embodiment of the present invention.

FIG. 1 illustrates a pixel 100 arranged in a part of the solid state image sensor of this embodiment and having a distance measuring function.

Light 101 entering the pixel 100 is propagated through the first optical waveguide 102 (the first core region 112, the first clad region 122) and the second optical waveguide 103 (the second core region 113, the second clad region 123).

Propagated light is absorbed by photoelectric conversion section 104 and converted into an electric signal. Note, however, that the photoelectric conversion section 104 is electrically controlled by means of metal wiring 106, gate electrode 107 and so on.

The first optical waveguide 102 operates in various guided modes for coupling that differ to correspond to the angles of incidence of light entering it.

Therefore, when light enters the first optical waveguide with a plurality of angles of incidence at a same time, it is coupled to different guided modes that differ to correspond to the angles of incidence and propagated in the optical waveguide 102 in different guided modes.

Then, as light is propagated in the optical waveguide 102 in different guided modes, the electromagnetic field modes are spatially separated in the optical waveguide.

A light shielding member 105 and a second optical waveguide 103 are arranged at the light exit end of the first optical waveguide 102 in order to selectively detect the spatially separated electromagnetic field modes in the photoelectric conversion section 104.

With this arrangement, the light shielding member 105 has a function of selectively shielding incident light at angle of incidence $-\theta$ (in the first direction) and blocking light entering the photoelectric conversion section 104.

On the other hand, the second optical waveguide 103 has a function of selectively and efficiently guiding incident light at angle of incidence $+\theta$ (in the second direction) to the photoelectric conversion section 104.

Figure 2:
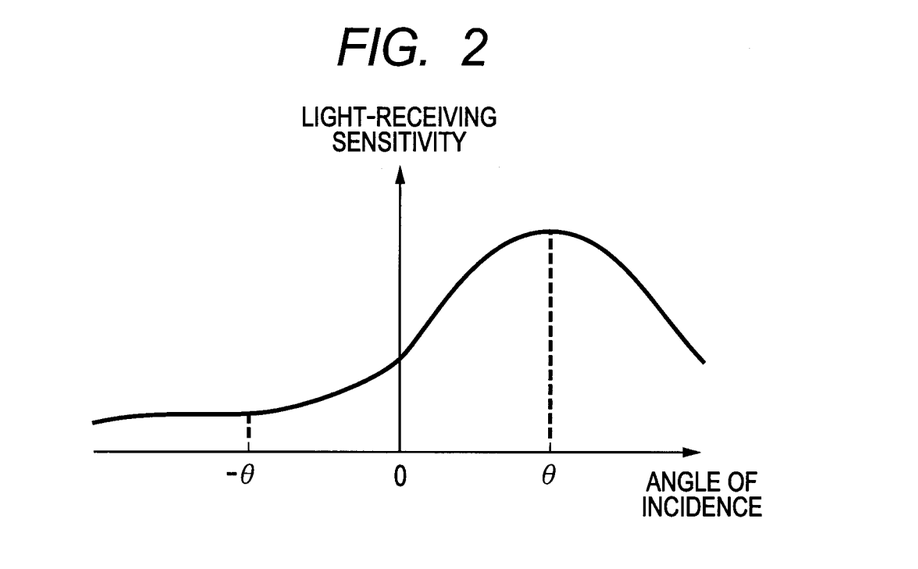
FIG. 2 is a graphic illustration of the angle of incidence dependency of the light-receiving sensitivity of the pixels of the first embodiment.

With the above-described arrangement, the photoelectric conversion section 104 can be made to show a light-receiving sensitivity relative to incident light that differs between the angle of incidence $-\theta$ (the first direction) and the angle of incidence $+\theta$ (the second direction) as seen in FIG. 2.

As this pixel 100 is arranged among the plurality of pixels of the image sensor, it detects the directions of rays of light entering the image sensor (the first direction and the second direction) so that the distance between the subject and the imaging area can be measured by means of a method that will be described hereinafter.

Note that the angle of incidence $-\theta$ (the first direction) and the angle of incidence $+\theta$ (the second direction) of incident light need to be separated clearly in order to make the image sensor show a precise distance measuring performance.

More specifically, the light-receiving sensitivity of the pixel 100 needs to be sufficiently higher relative to incident light from the second direction than relative to incident light from the first direction.

For this reason, the pixel 100 of this embodiment of the present invention is formed in such a way that the first optical waveguide and the second optical waveguide of the optical waveguide are arranged in series in the direction of propagation of light and the first and second core regions are formed by respective materials that make the refractive index of the second core region 113 higher than the refractive index of the first core region 112 and satisfy the requirement of the relationship of formula 1 shown below.

$$n3 > n1 \qquad \text{(formula 1)}$$

Note that the first core region 112 and the first clad region 122 of the first optical waveguide 102 show respective refractive indexes of n1 and n2, while the second core region 113 and the second clad region 123 of the second optical waveguide 103 show respective refractive indexes of n3 and n4.

Since the clad regions showing the respective refractive indexes of n2 and n4 are both normally made of a silica-based material, the refractive index n2 and the refractive index n4 are substantially equal to each other.

Then, the light-receiving sensitivity of the pixel 100 varies remarkably as a function of the angle of incidence of light and light coming from the first direction and light coming from the second direction can be clearly separated from each other. The reason for this will be described below.

Normally, when the requirement of the above formula 1 is satisfied, the ratio of the refractive index of the core region to that of the clad region of the first optical waveguide 102 (n1/n2) is smaller than the ratio of the refractive index of the core region to that of the clad region of the second optical waveguide (n3/n4).

Generally, the number of guided modes that can exist in an optical waveguide is small when the ratio of the refractive index of the core region to that of the clad region of the optical waveguide is small.

As the number of guided modes is reduced, spatial separation of electromagnetic field modes among different guided modes becomes remarkable. Therefore, light coupled to different guided modes that differ to correspond to the angles of incidence are spatially remarkably separated from each other.

Then, as a result, only incident light from the first direction can be efficiently blocked by arranging the light shielding member 105 at the light exit end of the first optical waveguide 102.

Additionally, when the refractive index n3 of the second core region 113 is made higher than the refractive index n1 of the first core region 112, light propagated through the second optical waveguide 103 penetrates into the clad region only with a short penetration depth so that it is confined in the core region.

Thus, incident light from the second direction that is propagated through the second optical waveguide is affected only to a small extent by the light scattering members and the light absorbing members including the metal wiring 106 and the gate electrode 107 and hence can be efficiently guided to the photoelectric conversion section 104. At the same time, the crosstalk noise to pixels around the pixel 100 due to scattering can be reduced.

As described above, the pixel 100 can be made to clearly separate light from the first direction and light from the second direction by arranging the first optical waveguide 102 and the second optical waveguide 103 so as to satisfy the requirement of the relationship of the formula 1.

Thus, the distance can be measured precisely by using the pixel 100 as ranging pixel.

In order to reduce the number of guided modes for improving the accuracy of distance measurement, the pixel size is reduced.

Generally, as the pixel size is reduced, the width of the core regions of the optical waveguide is reduced correspondingly.

As the width of the core regions is reduced, the number of guided modes of the optical waveguide is reduced so that light from the first direction and light from the second direction can be clearly separated for the above-described reason.

Thus, as the pixel size is reduced, the light-receiving sensitivity of the pixel 100 varies remarkably as a function of the angle of incidence of light. Then, as a result, the accuracy of distance measurement can be improved.

If the wavelength of incident light is in the visible range, desirably the unit length of a pixel is not greater than 2.5 µm. More desirably, the unit length of a pixel is not greater than 2.0 µm. Most desirably, the unit length of a pixel is not greater than 1.5 µm.

In this embodiment, the light shielding member 105 is arranged in such a way that the center position of the light shielding member 105 is shifted from the center axis of the pixel 100.

With this arrangement, light from the first direction can be efficiently and selectively blocked.

Note, however, that the center position of the light shielding member 105 may not necessarily be shifted from the center axis of the pixel 100. In other words, a similar effect can be achieved by arranging the light shielding member 105 in a central area and making the guided modes asymmetrical.

Then, the first optical waveguide is made to show a profile that is asymmetrical relative to the center axis of the pixel 100 in order to make the guided modes asymmetrical. Alternatively, the refractive index distribution may be made asymmetrical.

The first optical waveguide 102 and the second optical waveguide 103 may not necessarily be held in direct contact with each other. A film such as an insulating film may be arranged between the first optical waveguide 102 and the second optical waveguide 103.

A member made of a material showing a refractive index higher than the refractive index of the core region of the first optical waveguide and lower than the refractive index of the core region of the second optical waveguide may be arranged between the first core region 112 and the second core region 113 in order to improve the light-receiving sensitivity relative to incident light from the second direction.

Then, the refractive index changes mildly between the first core region and the second core region to raise the coupling efficiency between light being propagated through the first optical waveguide and the second optical waveguide.

As a result, the light-receiving sensitivity of the ranging pixel can be improved. Note, however, that the member of the above-described material may be buried in the core regions or provided as a film covering the core regions and the clad regions.

Now, the method of measuring the distance between the subject and the imaging area by means of the image sensor of this embodiment will be described below by referring to FIG. 3.

Figure 3:
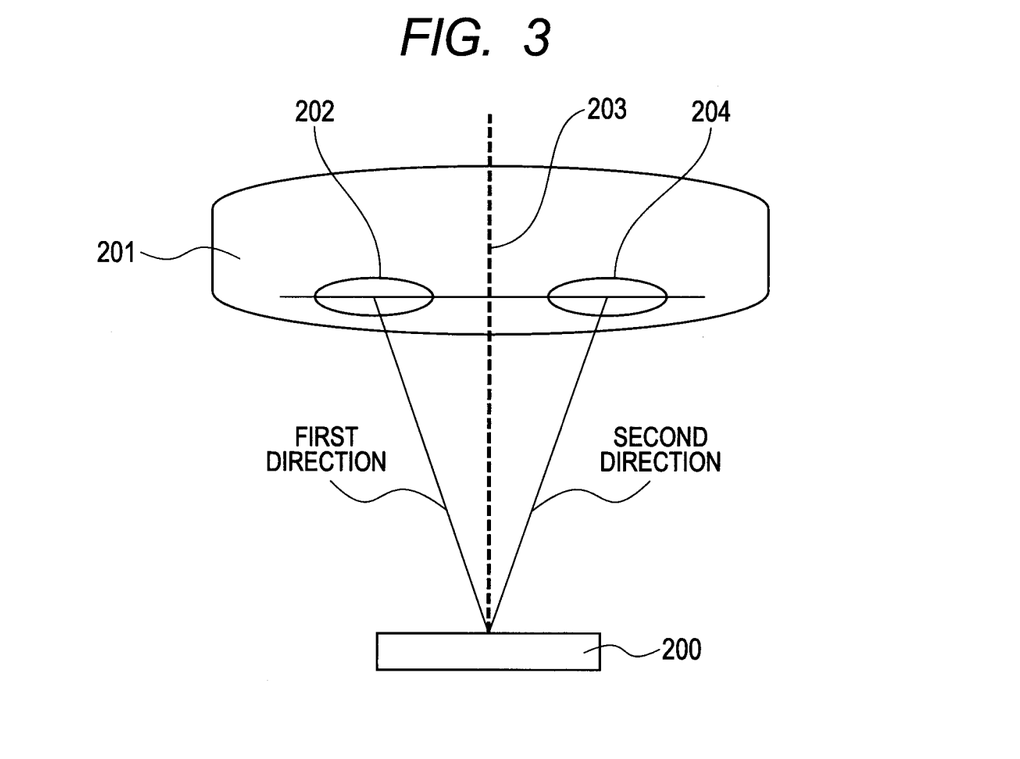
FIG. 3 is a schematic illustration of the method of measuring the distance to a subject by means of the image sensor of the first embodiment.

As shown in FIG. 3, imaging lens 201 forms an image of an external subject on the imaging area of the image sensor 200.

The image sensor 200 has a second pixel region provided with a plurality of pixels (second pixels) 100 for detecting incident light from the second direction shown in FIG. 1 and a first pixel region provided with a plurality of pixels (first pixels) for detecting incident light from the first direction. FIG. 3 illustrates the optical axis 203 of the imaging lens 201.

Note that the pixels for detecting light entering from the first direction may be arranged in such a way that they take a posture obtained by turning the pixel 100 shown in FIG. 1 by 180°.

Then, the fluxes of light that pass through different regions on the surface of the exit pupil of the imaging lens 201 strike the imaging area of the image sensor 200 as fluxes of light showing different angles of incidence because the imaging lens 201 and the image sensor 200 are separated by a long distance relative to the pixel size.

The pixels 100 included in the second pixel region mainly detect the fluxes of light that pass through the region 204 corresponding to the second direction (the second exit pupil region) of the exit pupil (the exit pupil of the optical system for forming a subject image) of the imaging lens 201.

Similarly, the pixels included in the first pixel region mainly detect the fluxes of light that pass through the region 202 corresponding to the first direction (the first exit pupil region) of the exit pupil of the imaging lens 201.

Thus, the images of light passing through different regions on the surface of the exit pupil of the imaging lens can be detected. Then, the pixel signal from the first pixel region and the pixel signal from the second pixel region are compared.

Then, with a known method, the distance between the subject and the imaging area of the image sensor can be detected when a ranging signal of the subject is output.

With the above-described manner, the light-receiving sensitivity relative to light entering from a specific angle is improved so that light passing through a specific region on the plane of the pupil can be selectively received to precisely measure the distance.

Now, a numerical example will be described below.

Figure 4:
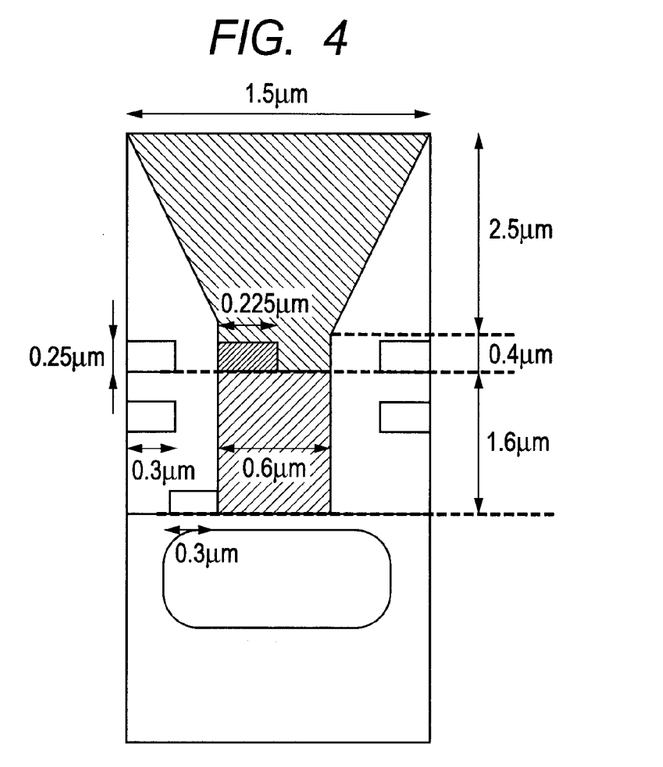
FIG. 4 is a schematic cross-sectional view of a ranging pixel arranged in a part of the solid state image sensor of the first embodiment showing the numerical example described below for the first embodiment.

FIG. 4 shows the configuration of the pixel 100, illustrating the numerical example.

With this numerical example, the first core region and the second core region are respectively made of an organic material and $TiO_2$ so as to show refractive indexes of 1.60 and 2.00.

Both the first clad region and the second clad region are made of a silica-based material so as to show a refractive index of 1.45.

Figure 5:
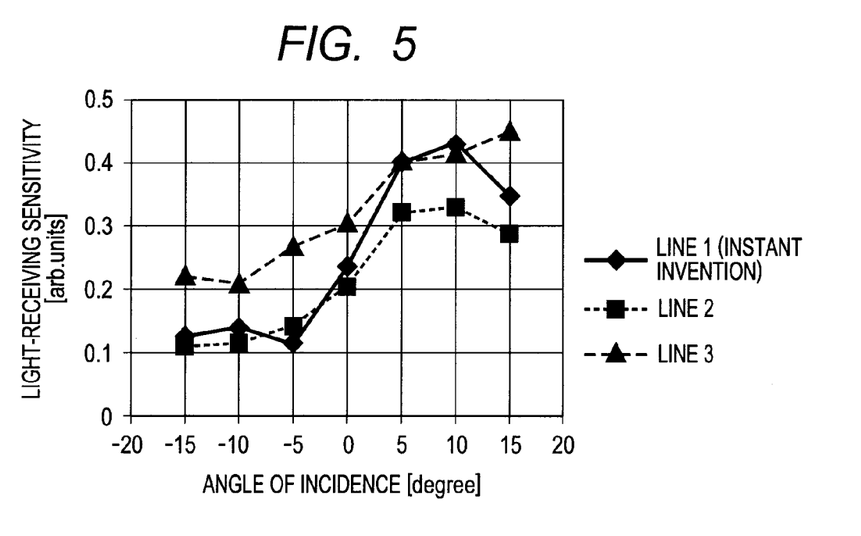
FIG. 5 is a graphic illustration of the angle of incidence dependency of the light-receiving sensitivity of the pixels of the first embodiment showing the numerical example described below for the first embodiment.

FIG. 5 (line 1) shows the light-receiving sensitivity characteristic of the photoelectric conversion section that varies as a function of the angle of incidence of light. For the purpose of comparison, FIG. 5 also shows the light-receiving sensitivity characteristic of the photoelectric conversion section that is obtained when both the refractive index of the first core region and that of the second core region are 1.60 (line 2) and the light-receiving sensitivity characteristic of the photoelectric conversion section that is obtained when both the refractive index of the first core region and that of the second core region are 2.00 (line 3).

From FIG. 5, it will be seen that the light-receiving sensitivity is high at the negative side of the angle of incidence (the first direction) when the first core region shows a refractive index of 2.00 (line 3 in FIG. 5).

For this reason, light entering at the positive side of the angle of incidence (the second direction) and light entering at the negative side of the angle of incidence (the first direction) cannot satisfactorily be separated from each other.

When, on the other hand, the first core region is made to show a refractive index of 1.60 (line 1 in FIG. 5), the light-receiving sensitivity is low at the negative side of the angle of incidence (the first direction).

Then, light from the positive side of the angle of incidence (the second direction) and light from the negative side of the angle of incidence (the first direction) can be selectively received.

From FIG. 5, it will also be seen that, when the second core region is made to show a refractive index of 1.60 (line 2 in FIG. 5), the light-receiving sensitivity to light from the positive side of the angle of incidence (the second direction) is low if compared with when the second core region is made to show a refractive index of 2.00 (line 1 in FIG. 5).

This is because light that is propagated through the second optical waveguide is not affected significantly by scattering and absorption due to the wiring and hence highly efficiently led to the photoelectric conversion section when the second core region is made to show a high refractive index.

Thus, light entering at the positive side of the angle of incidence (the second direction) and light entering at the negative side of the angle of incidence (the first direction) can satisfactorily be separated from each other by the photoelectric conversion section when the second core region is made to show a high refractive index.

From the above, with the arrangement according to the present invention (line 1 in FIG. 5), the first direction and the second direction can be clearly separated from each other and, as a result, the distance can be measured highly precisely.

[Second Embodiment]

Now, the second embodiment of solid state image sensor according to the present invention will be described below by referring to FIG. 6.

Figure 6:
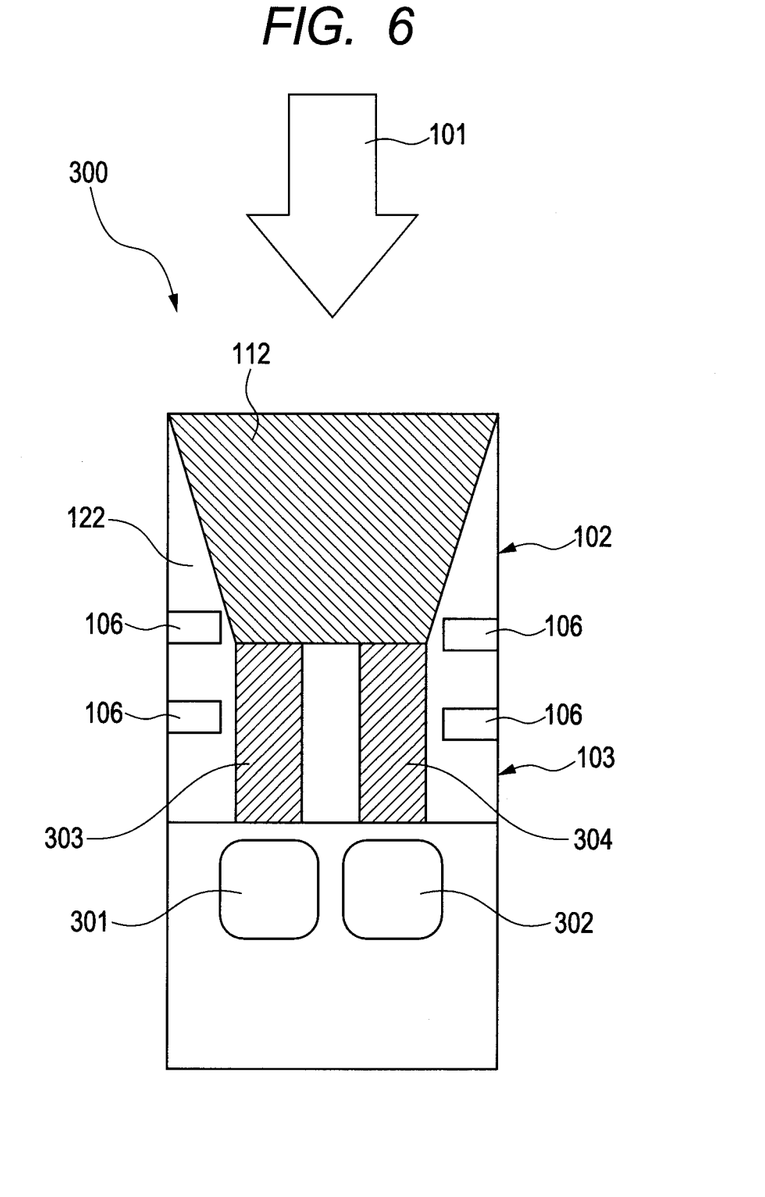
FIG. 6 is a schematic cross-sectional view of a ranging pixel arranged at a part of the solid state image sensor according to a second embodiment of the present invention.

FIG. 6 denotes a pixel 300 having a distance measuring function that is arranged in a part of the solid state image sensor of this embodiment.

The pixel 300 of the second embodiment differs from the pixel 100 of the first embodiment in that the pixel 300 has a first photoelectric conversion section 301 and a second photoelectric conversion section 302 that are independent from each other.

The pixel 300 of the second embodiment also differs from the pixel 100 of the first embodiment in that the second optical waveguide 103 is formed by using two core regions (the first core region 303, the second core region 304) instead of arranging a light shielding member 105 at the light exit end of the first optical waveguide 102.

Then, the first core region 303 of the second optical waveguide 103 is arranged right above the first photoelectric conversion section 301, while the second core region 304 of the second optical waveguide 103 is arranged right above the second photoelectric conversion section 302.

Besides, wiring 106 for controlling the signals of the first photoelectric conversion section 301 and the second photoelectric conversion section 302, the gate electrode 107 shown in FIG. 1 and so on are arranged appropriately in the clad region of the first optical waveguide 102, the clad region of the second optical waveguide 103 and so on.

The electromagnetic modes that are spatially separated by the first optical waveguide 102 are selectively detected at the first photoelectric conversion section 301 and the second photoelectric conversion section 302 by way of the first core region 303 and the second core region 304 of the second optical waveguide.

The first core region 303 of the second optical waveguide has a function of efficiently guiding light with the angle of incidence +θ (the second direction) to the first photoelectric conversion section 301 in a selective manner.

The second core region 304 of the second optical waveguide has a function of effectively guiding light with the angle of incidence −θ (the first direction) to the second photoelectric conversion section 302 in a selective manner.

The refractive index of the core region 112 of the first optical waveguide is made lower than the refractive index of the first core region 303 and that of the second core region 304 of the second optical waveguide.

With the above-described arrangement, the guided modes can be spatially separated by the first optical waveguide according to the angle of incidence and light can be efficiently guided to the first photoelectric conversion section 301 and the second photoelectric conversion section 302 by way of the first core region 303 and the second core region 304 of the second optical waveguide as in the case of the first embodiment.

Then, the distance can be precisely measured by arranging the first photoelectric conversion section 301 for selectively receiving light from the second direction and the second photoelectric conversion section 302 for selectively receiving light from the first direction in a plurality of pixels of the image sensor.

In this embodiment, the second optical waveguide 103 is made to have two core regions including the first core region 303 and the second core region 304. However, the second optical waveguide 103 may not necessarily have two core regions and may alternatively have four core regions or a different number of core regions to function in a similar way.

[Third Embodiment]

A process of manufacturing a solid state image sensor having a pixel 100 as shown in FIG. 1 will be described below by referring to FIGS. 7A through 7G for the third embodiment of the present invention.

Figure 7A:
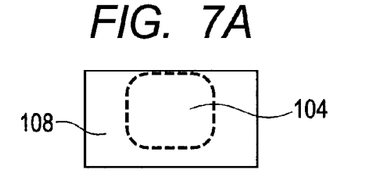
FIGS. 7A, 7B, 7C, 7D, 7E, 7F and 7G are schematic illustrations of the process of manufacturing the solid state image sensor according to a third embodiment of the present invention and having a ranging pixel as shown in FIG. 1.

Firstly, a silicon oxide film (not shown) is formed on the surface of a silicon substrate 108 by thermal oxidation. Then, a resist mask of photoresist is formed at a predetermined position and impurity ions are implanted in order to form a photoelectric conversion section 104 in the silicon substrate 108. Thereafter, the resist mask is removed typically by asking. Subsequently, a diffusion layer (not shown) is formed also by ion implantation, using a similar technique (FIG. 7A).

Furthermore, a polysilicon film is formed to form a gate electrode 107 for transferring the electric charge generated in the photoelectric conversion section 104.

Figure 7B:
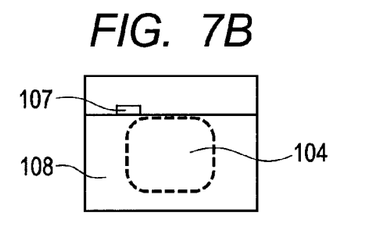

Then, a gate electrode 107 is formed by etching the polysilicon to a predetermined pattern by means of a photolithography technique.

Thereafter, an interlayer insulating layer of BPSG (boron phosphor silicate glass), for example, is formed on the silicon substrate 108 and the gate electrode 107 and an operation of planarization is conducted by means of a CMP (chemical mechanical polishing) method (FIG. 7B).

Figure 7C:
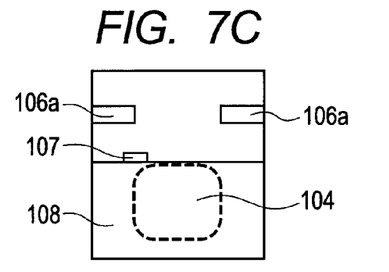

Then, connection holes such as contact holes are formed through the interlayer insulating layer for electric connections to other metal wirings. Similarly, a first wiring 106a is formed and covered by the interlayer insulating layer (FIG. 7C).

Figure 7D:
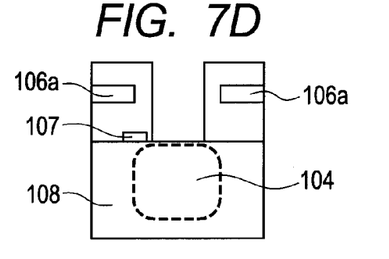

Subsequently, a resist mask of photoresist is formed at a predetermined position and the interlayer insulating layer is etched typically by dry etching in order to form a core region 113 in the second optical waveguide (FIG. 7D)

Figure 7E:
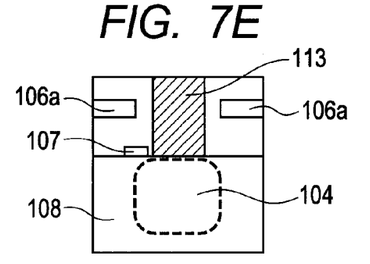

Furthermore, substances showing a high refractive index such as SiN and $TiO_2$, for example, are buried in the etched region typically by CVD and then an operation of planarization is conducted by means of a CMP method (FIG. 7E).

The core region 113 of the second optical waveguide is desirably made of an inorganic material that scarcely influences the subsequent processing steps.

Figure 7F:
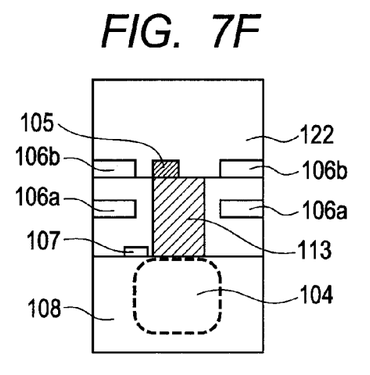

Then, a light shielding member 105 and a second wiring 106b are formed like the first wiring 106a and covered by the interlayer insulating layer 122 such as $SiO_2$ or BPSG (FIG. 7F).

Figure 7G:
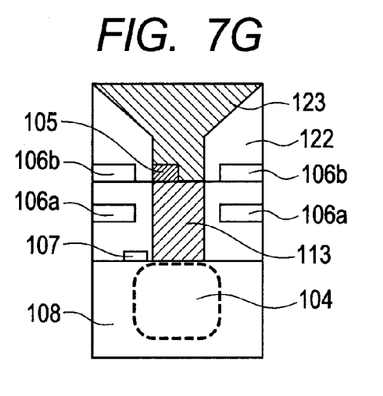

Then, a resist mask of photoresist is formed at a predetermined position and etched typically by dry etching to produce, if necessary, a tapered profile in order to form a core region 123 in the first optical waveguide. Furthermore, an organic material showing a high refractive index is buried into the etched region (FIG. 7G).

The core region 123 of the first waveguide is desirably formed by using an organic material in order to produce only few air voids, when it is buried in a region showing a tapered profile and a high aspect ratio.

Then, if necessary, a color filter is formed (not shown).

While the first embodiment through the third embodiment are described above as so many front surface type CMOS solid state image sensors, the present invention is equally applicable to rear surface type CMOS solid state image sensor by using similar optical waveguides.

Furthermore, the present invention is equally applicable to solid state image sensors of other types such as CCD solid state image sensors.

[Fourth Embodiment]

In this embodiment, a solid state image sensor according to the present invention is utilized as the image sensor of a digital camera.

Figure 8:
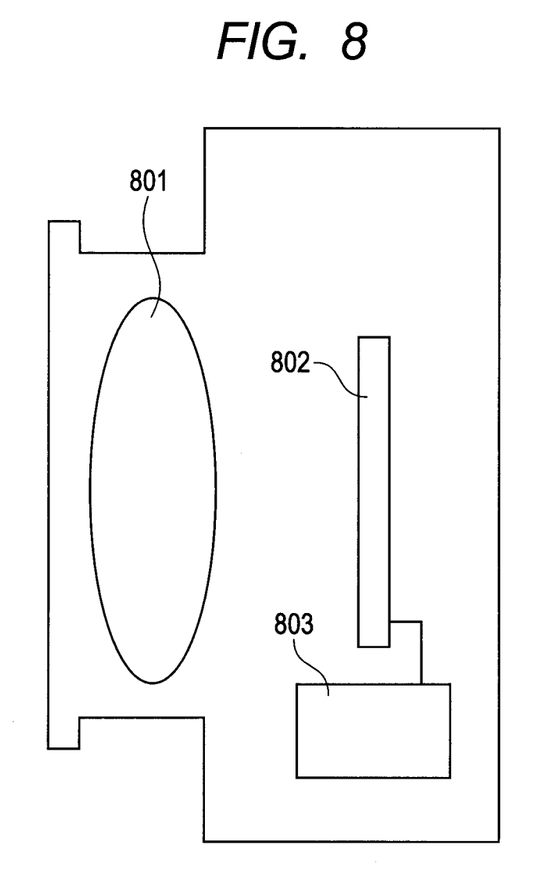
FIG. 8 is a schematic illustration of a digital camera loaded with a solid state image sensor according to the present invention.

FIG. 8 is a schematic illustration of a digital camera of the present embodiment.

FIG. 8 illustrates an imaging lens 801, a solid state image sensor 802 according to the present invention and an arithmetic processing section 803. An image of a subject is formed in the solid state image sensor 802 by way of the imaging lens 801 and an arithmetic process is executed by the arithmetic processing section 803 on the basis of the electric signals generated in the solid state image sensor. Then, an image to be displayed is formed.

Since a solid state image sensor according to the present invention can highly precisely measure distances, the camera of this embodiment can operate for high speed and high precision auto-focusing so that the camera can acquire a high definition image when picking up a moving picture.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-264609, filed Nov. 29, 2011, which is hereby incorporated by reference herein in its entirety.

What is claimed is:

1. A solid state image sensor having a plurality of ranging pixels, each of the ranging pixels including:
    a plurality of photoelectric conversion sections for converting light into an electric signal; and
    an optical waveguide including a core region and a clad region arranged at a light-receiving side of the photoelectric conversion section, wherein
    the optical waveguide has at least two optical waveguides including a first optical waveguide and a second optical waveguide, the second optical waveguide being arranged closer to the photoelectric conversion sections than the first optical waveguide,
    the first optical waveguide has a single contiguous core region, and
    the second optical waveguide has a plurality of core regions, each core region of the second optical waveguide transmitting light from the single contiguous core region of the first optical waveguide to one of the photoelectric conversion sections of the plurality of photoelectric sections.

2. The solid state image sensor according to claim 1, wherein the single contiguous core region of the first optical waveguide has a refractive index lower than each refractive index of the core regions of the second optical waveguide.

3. The solid state image sensor according to claim 1, wherein the core region of the first optical waveguide comprises an organic material.

4. The solid state image sensor according to claim 1, wherein the core regions of the second optical waveguide comprise an inorganic material.

5. The solid state image sensor according to claim 1, further comprising a member having a refractive index higher than the refractive index of the core region of the first optical waveguide and lower than the refractive indexes of the core regions of the second optical waveguide, the member being arranged between the first optical waveguide and the second optical waveguide.

6. The solid state image sensor according to claim 1, wherein the first optical waveguide has a profile that is asymmetrical relative to the center axis of the ranging pixel.

7. A camera comprising an imaging lens, the solid state image sensor according to claim 1, and an arithmetic processing section.

* * * * *